US006828598B1

(12) United States Patent
Coffa et al.

(10) Patent No.: US 6,828,598 B1
(45) Date of Patent: Dec. 7, 2004

(54) SEMICONDUCTOR DEVICE FOR ELECTRO-OPTIC APPLICATIONS, METHOD FOR MANUFACTURING SAID DEVICE AND CORRESPONDING SEMICONDUCTOR LASER DEVICE

(75) Inventors: Salvatore Coffa, Tremestieri Etneo (IT); Sebania Libertino, Catania (IT); Mario Saggio, Catania (IT); Ferruccio Frisina, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/653,390

(22) Filed: Sep. 1, 2000

(30) Foreign Application Priority Data

Sep. 2, 1999 (EP) .............................. 99830544

(51) Int. Cl.$^7$ .............................................. H01L 33/00
(52) U.S. Cl. .......................... 257/102; 257/103; 372/44
(58) Field of Search ......................................... 257/102

(56) References Cited

U.S. PATENT DOCUMENTS

| 5,045,498 | A |   | 9/1991 | Wang et al. ................. 437/129 |
| 5,107,538 | A | * | 4/1992 | Benton et al. ............... 385/130 |

FOREIGN PATENT DOCUMENTS

EP       517440       12/1992   ............. H01S/3/06

OTHER PUBLICATIONS

Patent Abstract of Japan Publication No. 01074783. Publication Date: Mar. 20, 1989. Inventor: Ogita Shoichi "Semiconductor Light–Emitting Device."
Document No. XP002129644. Franzo, et al. "Mechanism and Performance of Forward and Reverse Bias Electroluminescence at 1.54 $\mu$m From Er–doped Si Diodes" Mar. 1997. pp. 2784–2793.
Document No. XP002129645. Coffa, et al. "Direct Evidence of Impact Excitation and Spatial Profiling of Excited Er in Light Emitting Si Diodes" Jul. 1998. pp. 93–95.

* cited by examiner

Primary Examiner—Douglas Wille
(74) Attorney, Agent, or Firm—Lisa K. Jorgenson; Allen, Dyer, Doppelt, Milbrath & Gilchrist, P.A.

(57) ABSTRACT

A semiconductor device for electro-optic applications includes a rare-earth ions doped P/N junction integrated on a semiconductor substrate. The semiconductor device may be used to obtain laser action in silicon. The rare-earth ions are in a depletion layer of the doped P/N junction, and are for providing a coherent light source cooperating with a waveguide defined by the doped P/N junction. The doped P/N junction may be the base-collector region of a bipolar transistor, and is reverse biased so that the rare-earth ions provide the coherent light.

16 Claims, 6 Drawing Sheets

SEMICONDUCTOR DEVICE FOR ELECTRO-OPTIC APPLICATIONS, METHOD FOR MANUFACTURING SAID DEVICE AND CORRESPONDING SEMICONDUCTOR LASER DEVICE

FIELD OF THE INVENTION

The present invention relates to semiconductor devices, and, more particularly, to a semiconductor device for electro-optic applications and a corresponding semiconductor laser device. The semiconductor device includes a rare-earth ions doped P/N junction integrated on a semiconductor substrate.

BACKGROUND OF THE INVENTION

Silicon is the material most commonly used for manufacturing advanced microelectronic devices. Current electronic manufacturing technology may be considered mature, but a new optical communication technology is emerging. In optical communication technology, basic information is carried by optical signals having standard wavelengths in a range between 1.3 and 1.55 microns.

It would be highly desirable to combine optical and electronic functions in silicon to implement optical-electronic applications in a single semiconductor device. Significant progress has recently been made in the combination of electronic and optical technologies for manufacturing semiconductor optical devices operating at near infrared wavelengths.

A few examples may be found in the following three articles: 1) optical waveguides can be made with low losses, as disclosed by Fisher et al. in the IEEE article titled "Photonics Technology Letters" 8, 647 (1996); 2) light emitting diodes based on erbium (Er) doping have been demonstrated, as reported by Coffa et al. in the MRS Bulletin on "Si-based optoelectronics" 23, 4, edited by Materials Research Society, S. Coffa and L. Tsybeskov guest editors; and 3) optical switches based on an electro-optic effect can be formed on silicon, as disclosed by Cutolo et al. in Lightwave Technology 15, 505 (1997)

There is, however, a main limitation for using silicon in optical applications such as, for example, optical interconnections intra-chip or between chips. This main limitation is due to the lack of a coherent light source, i.e., a silicon-based laser. Silicon is not suitable as an efficient light emission due to its indirect band gap.

Several approaches have been used to try to overcome this problem. The use of optical doping of silicon with rare earth ions, with or without impurities such as O, F, and N presents several interesting features not only for manufacturing efficient light emitting diodes, but also for the attempt of forming a silicon-based laser. Efficient room temperature electro-luminescence from erbium-oxygen co-doped silicon diodes has been reported. Moreover, the long spontaneous lifetime of the first excited state of erbium (about 1 ms), can insure a population inversion which is needed for an efficient light emission.

To fully understand all the aspects of the present invention, a schematic diagram of the mechanisms connected to electrical pumping of erbium ions are shown in FIGS. 1, 2a, 2b, 3a and 3b. A room temperature electro-luminescence at a 1.54 µm wavelength can be achieved when Er ions are incorporated into a P/N diode junction.

A known approach is disclosed in U.S. Pat. No. 5,107,538 that relates to an optical waveguide system comprising a rare-earth Si-based optical device. This device, however, only produces a luminescence at a temperature close to 4 K and the efficiency of the light emission is extremely reduced at room temperature. Moreover, the '538 patent fails to disclose the use of rare-earth ions located inside the junction. Therefore, the light emission obtained by this technology is insufficient for implementing commercial devices, and no electro-optical products on silicon are currently known to be on the market.

SUMMARY OF THE INVENTION

In view of the foregoing background, an object of the present invention is to provide a semiconductor device having structural and functional features to allow implementation of a coherent light emitting source into a semiconductor substrate that includes a rare-earth ions doped junction. The semiconductor substrate may be silicon.

Another object of the present invention is to allow optical interconnections intra-chip or between chips.

Yet another object of the present invention is to provide a single chip integrated semiconductor laser device. The semiconductor substrate may be silicon.

A further object of the present invention is to provide an electrically pumped optical amplification and laser action at room temperature.

These and other objects, advantages and features are provided by an electrically pumped optical amplification, and laser action using erbium-doped crystalline silicon. The semiconductor device according to the present invention comprises an erbium-doped P/N junction integrated within a semiconductor cavity or waveguide.

The invention allows combination of impact excitation of Er ions by hot carriers in the depletion layer of the reverse biased junction with a proper Er doping and electric field distribution. Electro-optical amplification is provided when the Er ions are within the depletion layer of the semiconductor device. The Er ions provide proper acceleration of the carriers before they enter the Er-doped region.

Accordingly, the present invention is directed to a semiconductor device, a semiconductor laser device, and a method for manufacturing a semiconductor device.

BRIEF DESCRIPTION OF THE DRAWINGS

The features and the advantages of the semiconductor device and corresponding manufacturing method according to the invention, will become clear from the following description of a preferred embodiment given as a non-limiting example with reference to the attached drawings.

DETAILED DESCRIPTION OF THE PREFERRED EMBODIMENTS

Figure 1:
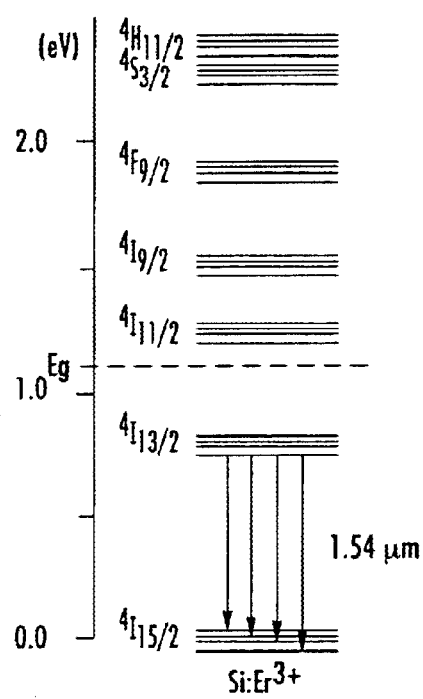
FIG. 1 shows the 4$f$ electronic levels of an erbium ion and the transitions giving rise to a 1.54 µm light emission according to the prior art.
Figure 2:
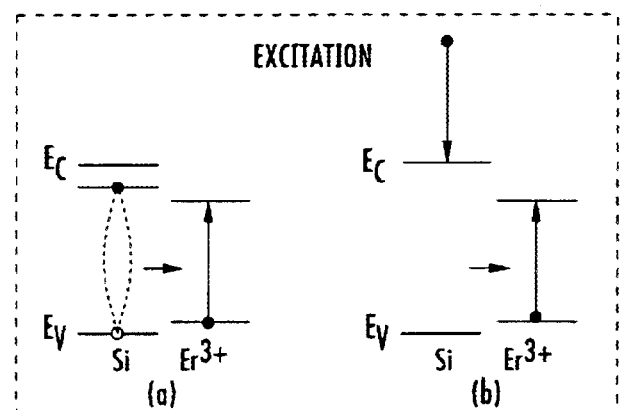
FIGS. 2a and 2b respectively show the excitation mechanism for rare earth ions in crystalline silicon according to the prior art, with the specific case of Er ions being illustrated.
Figure 3:
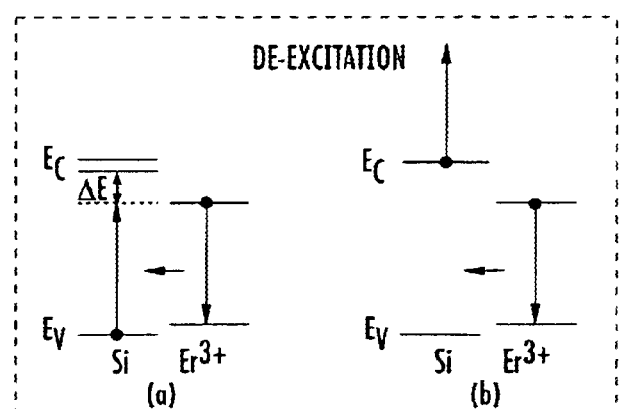
FIGS. 3a and 3b respectively show the de-excitation mechanisms for rare earth ions in crystalline silicon according to the prior art.
Figure 4:
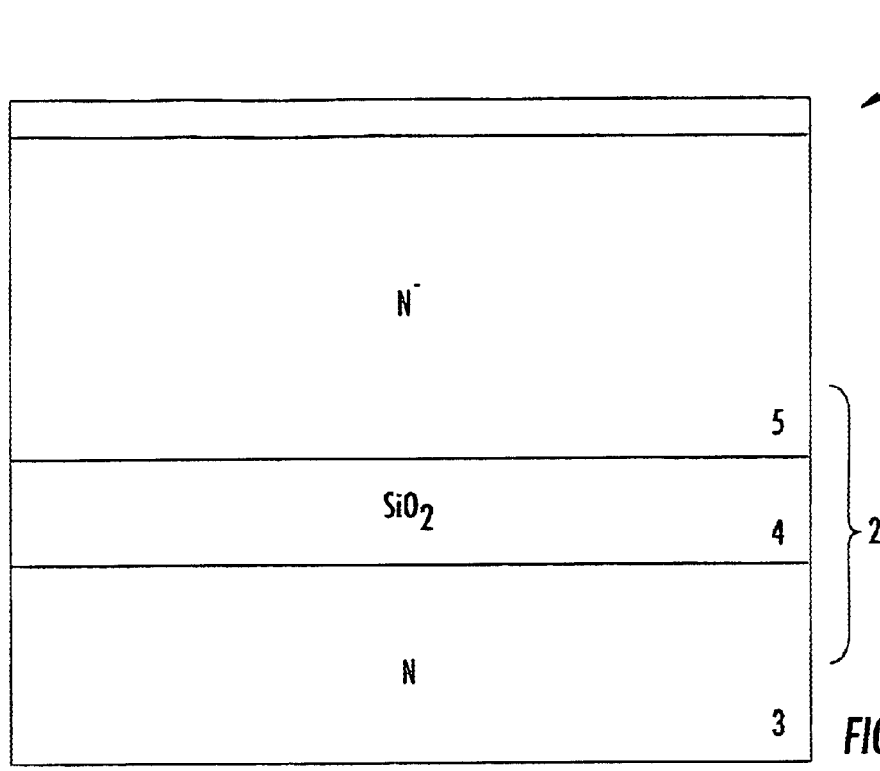
FIGS. 4 to 8 are schematic cross sectional views of a semiconductor device according to the present invention during subsequent manufacturing process steps.

With reference to the enclosed drawings, reference 1 is a semiconductor device formed according to the present invention for electro-optic applications. The semiconductor material is preferably silicon. The process for manufacturing the semiconductor device 1 will now be disclosed. The specific features of the semiconductor device 1 will be discussed in greater detail below.

The manufacturing process will now be described step by step. A silicon-on-insulator (SOI) wafer is provided as a substrate 2 for the semiconductor device 1. A known SIMOX or BESOI technology may be used to provide the SOI wafer. However, instead of using an SOI wafer, the substrate for the semiconductor device 1 may simply comprise a double layer of a semiconductor material. For instance, the double layer may include a first highly doped substrate layer and a second upper lightly doped epitaxial layer. In such a case, the lower substrate layer would have a lower refraction index and would act as a reflective layer for the incident light.

The SOI substrate 2 is formed by a first lower monocrystalline layer 3, an oxide layer 4, and a second upper monocrystalline layer 5. The first and the second monocrystalline layers may be doped with a dopant having a first conductivity type, for instance N-type. The second upper layer 5 is less doped than the first lower layer 3. An oxide layer 7 is grown on top of the substrate 2, that is, over the second upper monocrystalline layer 5.

Figure 5:
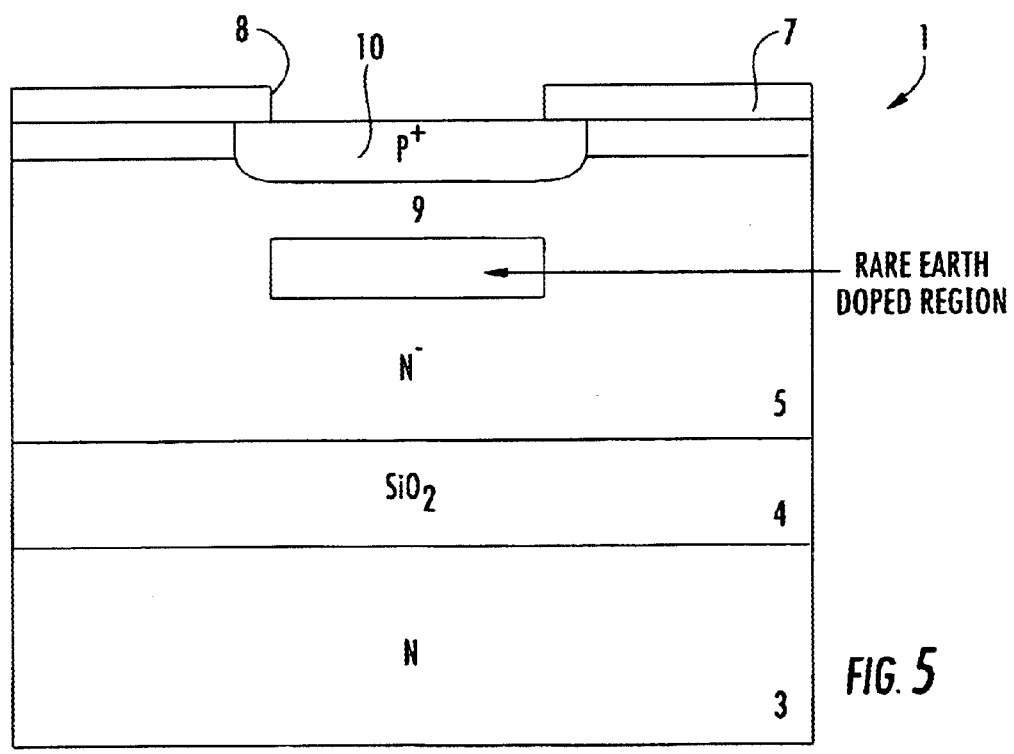

A photolitographic process step is then provided to define an aperture 8 in the oxide layer 7 and to selectively form a doped region 10. The dopant used for this region 10 has an opposite conductivity type, for instance P-type. A masked implantation step of B ions in the upper layer 5 allows formation of this P+ doped region 10, as shown in FIG. 5. Through the same mask, a rare-earth ions doped region 9 is formed. For example, an ion implantation process step is performed to obtain a region 9 under the P+ doped region 10, as shown in FIG. 5. Preferably, the rare earth ions are selected from the group comprising erbium (Er). A proper co-doping with other impurities, such as O, F, and N may also be used.

Rare earths (RE) incorporation can be achieved using different techniques, such as ion implantation, molecular beam epitaxy (MBE), chemical vapor deposition (CVD), ion assisted deposition, and Si-epitaxial regrowth on shallow RE-doped regions. As readily appreciated by one skilled in the art, the different techniques may require different process steps.

The region 9 is an N-type doped region and the stack formed by the regions 5, 9 and 10 form substantially a P/N diode junction. The semiconductor device structure of the present invention is similar to a base-collector junction of a bipolar transistor.

Figure 13:
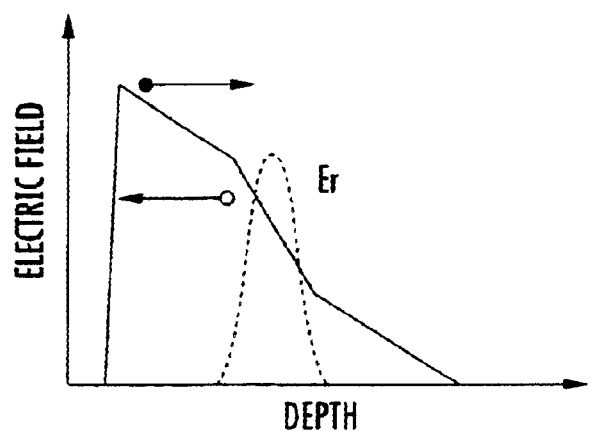
FIG. 13 shows a diagram of the electric field versus doping depth for the semiconductor device according to the present invention.

Advantageously, all the implanted Er ions are incorporated in the depletion layer of the P/N junction formed by the regions 5, 9 and 10, as clearly shown in FIG. 13. Alternatively, all the implanted Er ions are incorporated in the depletion layer of the base-collector region of the bipolar transistor.

A masked etching process step is then performed to protect the stacked regions 5, 9 and 10 and to etch the semiconductor at both sides of the regions 9 and 10. This is done to provide a projecting stack region 6 formed just by the P+ doped region 10 and part of the region 5. A dry or wet etching step may be used for etching the semiconductor.

Figure 6:
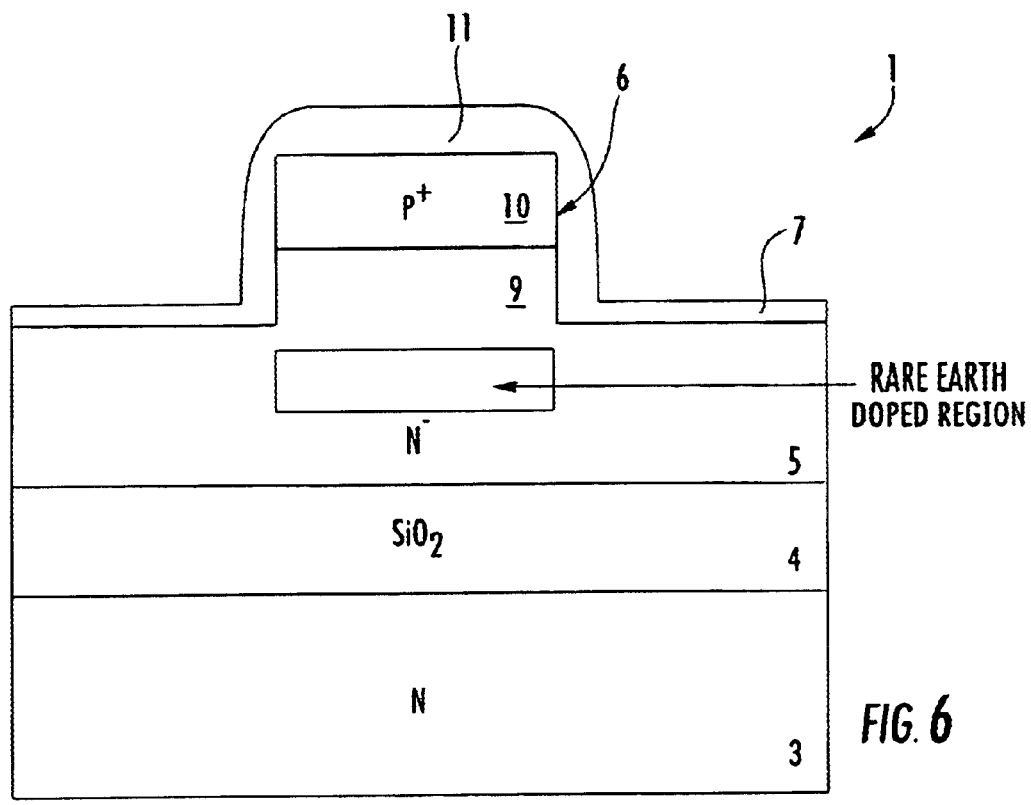

A protective oxide layer 11 is deposited over the resulting stack, as shown in FIG. 6. This protective oxide layer 11 covers the stack 6, which is formed by the regions 9 and 10, and has a lower dielectric constant. As a result, a laser cavity or waveguide is obtained on silicon with the oxide layer 11 delimiting the sides of the waveguide and the buried oxide layer delimits the bottom of the waveguide.

The device obtained with the inventive method allows light to be confined in a two dimensional plane perpendicular to the direction of propagation of the electromagnetic wave. Hence, the semiconductor region containing the gain medium, i.e., the erbium ions concentration, is surrounded by a cavity structure or waveguide delimited by a material having a lower refractive index.

Figure 9:
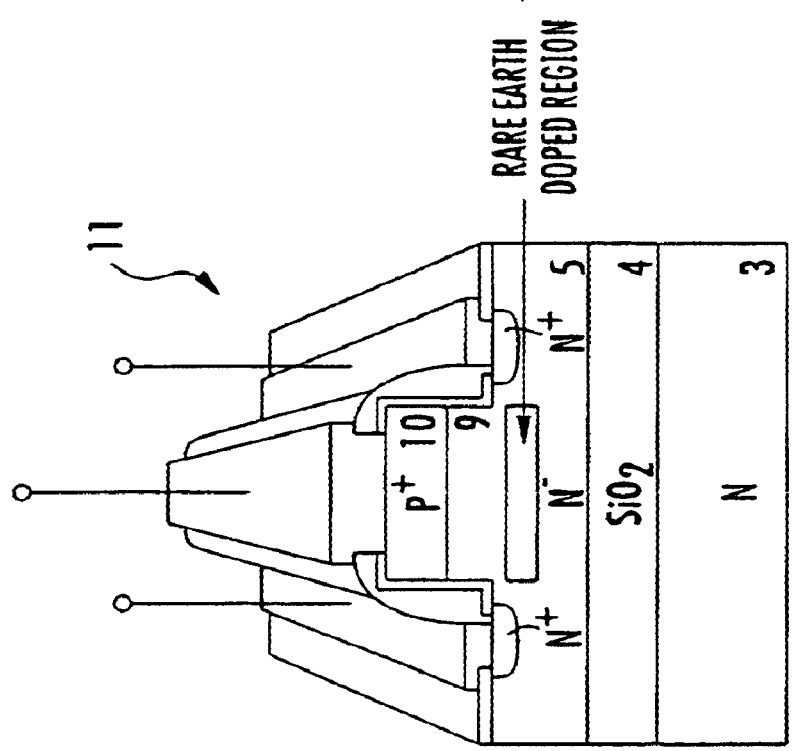
FIG. 9 shows a cross-sectional perspective view of a semiconductor device according to the present invention.

Referring to FIG. 9, a waveguide having substantially a ribbed elongated structure is shown. However, other examples may be proposed such as planar waveguides in which the lateral confinement is obtained. For instance, shallow trenches may be filled by a lower refractive index material, or by heavily doped regions, which are some of the many possible alternatives.

Figure 7:
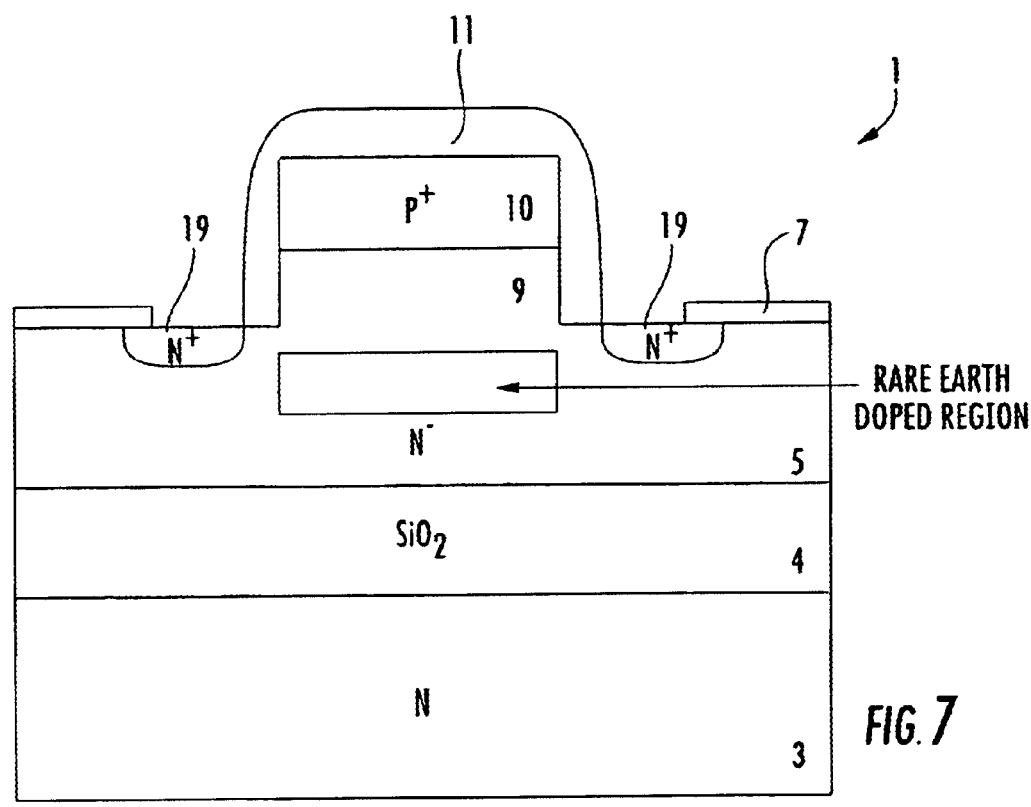

The manufacturing process is continued using another masked implantation step of N-type dopants. Using a suitable mask (not shown), a portion of the protective oxide layer 11 is removed over the upper substrate layer 5, which is close to the stack 6. N-type dopants, for instance P-type ions, are implanted in the upper layer 5 to form contact N+ regions 19, as shown in FIG. 7.

Figure 8:
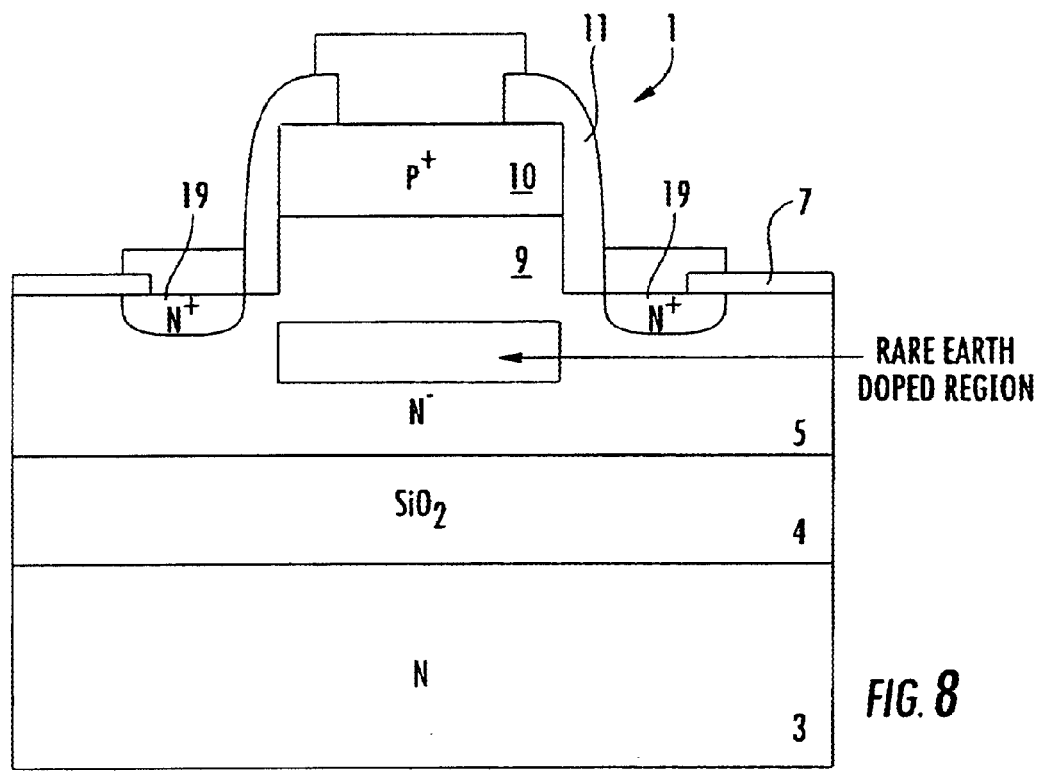
Figure 10:
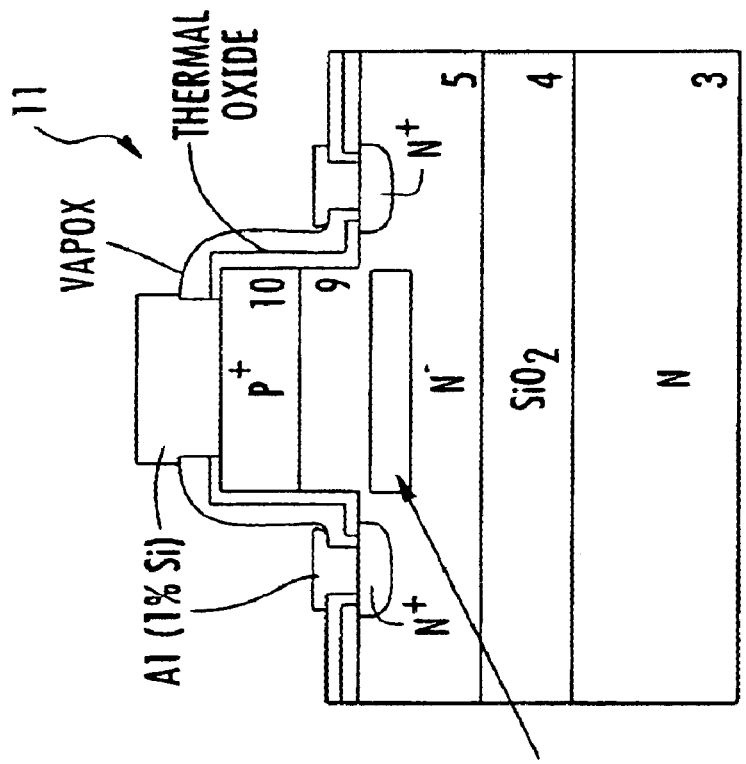
FIG. 10 shows a schematic vertical cross-sectional view of the semiconductor device of FIG. 9 showing the location of the rare earth ions needed to achieve laser action.

An additional oxide layer in deposited over the whole semiconductor portion and a masked process is used to define contact openings over the P+ region 10 and over the N+ regions 19. A final deposition step of a metal layer, followed by a lithography step, is performed to define the metal contacts on the P+ and N+ regions 10 and 19, as shown in FIG. 8. The resulting structure is clearly shown in FIG. 9, which is a schematic vertical cross-section and perspective view of the semiconductor device 1 including a cavity or waveguide and a P/N diode junction.

An evaluation of the specific features of the semiconductor device structure 1 obtained according to the process previously disclosed will now be discussed. Er ions can be effectively pumped by electron-hole (e-h) recombination under a forward bias diode operation at temperatures below 200 K. However, a phenomenon know as Auger de-excitation and back energy transfer strongly reduces the efficiency of light emission at higher temperatures.

According to the invention, these negative effects are fully inhibited under reverse bias conditions, thereby allowing strong light emission to be achieved at room temperature. In fact, all of the implanted Er ions are incorporated in the depletion layer of a P/N junction or, alternatively, in the depletion layer of the base collector region of the bipolar transistor.

Since rare earth ions are incorporated in a depletion layer, electrical pumping of these ions can be achieved in different device structures, such as Schottky diodes, bipolar transistors, MOSFET devices, etc. Moreover, a sufficient acceleration space is provided before carriers enter the Er doped regions. Acceleration is provided either by tunneling in a reverse biased P/N junction or injected by the emitter-base junction of a transistor. Following this approach population inversion will be extended to all of the Er ions.

After having achieved laser operation at room temperature, an efficient electronic pumping effect can be maintained at room temperature according to the present invention. Therefore, a semiconductor laser device may be formed incorporating the rare-earth ions in a laser cavity which presents low losses at the emission wavelength.

In this respect, the use of a silicon substrate is certainly an advantage since a silicon semiconductor is almost transparent at the 1.54 $\mu$m wavelength. Integrated silicon waveguides using silicon as the core material and silicon oxide (SiO2) as claddings have already been manufactured with losses as low as 0.1 dB/cm.

According to the invention, rare-earth ions doping of these waveguides within an integrated device structure allowing electrical pumping of the rare earth ions can be used to produce the laser cavity. Diode operation at the diode breakdown threshold results in an intense light emission at 1.54 $\mu$m, characterized by an internal quantum efficiency of about 0.1%. It may be demonstrated that in such a structure the Er ions are pumped to the excited levels as a result of impact excitation by hot carriers. Impact excitation with hot carriers is provided to invert Er population rather than electron-hole recombination.

During pumping, the losses due to the free electrons will be fully inhibited and the laser action would benefit from the extremely low losses that intrinsic silicon exhibits at 1.54 $\mu$m since the Er ions are embodied in the depletion layer of a junction. This amplification gain at 1.54 $\mu$m can overcome waveguide losses and laser action can be achieved if a cavity reflector structure is formed.

To discuss how to obtain a proper laser action, reference is still made to the schematic view of FIG. 9. The semiconductor device 1 is formed using an SOI substrate 2 and the process previously disclosed. The stacked P/N junction is doped with rare earth ions. Er pumping will result in light emission coupled to the fundamental modes of the cavity. This structure could be used both as an electrically pumped optical amplifier or as a laser if proper feedback is applied. Split output and input waveguide facets, or distributed Bragg reflector structures can be suitably used to provide the feedback needed for laser action.

The most important limitation that the invention has overcome was an insufficient Er concentration to achieve a laser action at 1.54 $\mu$m in the Er-doped silicon substrate using an integrated waveguide. Since erbium in silicon acts as a donor, a high concentration of free electrons in the region where erbium sits is present. To incorporate high Er concentration in silicon semiconductor, co-doping with impurities such as O and F plays a fundamental role. However, this co-doping also produces a strong donor activity of the Er ions resulting in a high concentration of free electrons in the region where Er sits.

When erbium is incorporated within a structure, such as the channel waveguide previously disclosed, the strong concentration of free electrons will produce by the plasma dispersion effect strong losses which would make the achievement of a net gain impossible. Free carrier concentration has to be maintained below $10^{17}/cm^3$ to achieve low losses.

Due to the donor behavior of Er, both the real and the imaginary part of the refractive index are strongly affected by the high free carrier concentration, and the mode tends to escape from the region where Er sits. Moreover, effective losses as high as approximately 200 $cm^{-1}$ can be obtained.

A problem to be solved results from the use of impact excitation of Er ions in reverse biased P/N junctions because of the existence of a dark region in the central portion of the depletion layer where carriers do not have enough energy to pump Er ions.

Figure 11:
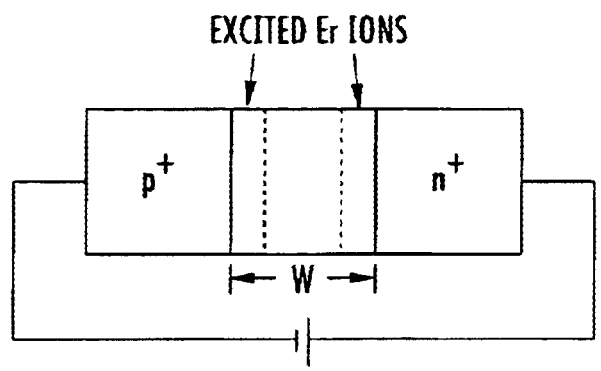
FIG. 11 shows a schematic view of a dark region in the central depletion layer where Er ions are pumped by impact excitation according to the prior art.
Figure 12:
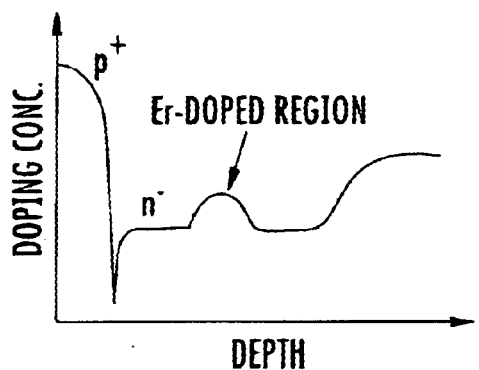
FIG. 12 shows a diagram of the doping concentration versus doping depth for the semiconductor device according to the present invention.

It has been experimentally demonstrated by Coffa et al., Appl. Phys. Lett. 73, 93 (1998) that a region of about 400 Å in the central portion of about a 1000 Å thick depletion layer is dark. Such a behavior is schematically shown in FIG. 11. The peculiar feature of impact excitation is due to the existence of a threshold. If the energy of the carrier is lower than that required to promote the Er ions to the first excited state (0.8 eV) the process cannot occur. A second problem is that the Er ions sitting outside the depletion layer cannot be pumped by this mechanism. Consequently, they will not be excited but will adsorb light at 1.54 $\mu$m.

The Er population cannot be inverted in the central part of the diode since the energy of the carriers, produced by band to band tunneling and then accelerated by the strong electric field present at the junction, is not sufficient to pump Er. An effective pumping of Er ions to achieve population inversion and the capability of maintaining low losses in the Er doped waveguides is achieved by the inventive structure. How the invention solves these two problems is examined in detail below.

The inventive device and method solve all the previously discussed problems by incorporating all the implanted Er ions in the depletion layer of the P/N junction and providing: 1) a sufficient acceleration space before carriers enter the Er-doped regions, 2) population inversion extended to all the Er ions, and 3) inhibition of loss due to free electrons because the erbium ions are embodied in the junction depletion layer. The laser action would benefit from the extremely low loss that intrinsic Si exhibits at 1.54 $\mu$m. Er has been placed where the maximum of the mode sits. Since the erbium ions are in the depletion region, the free carrier concentration strongly decreases and an effective loss as low as 0.6 $cm^{-1}$ has been evaluated.

What is claimed is:

1. A semiconductor laser device for electro-optic applications comprising:

a semiconductor substrate;

a doped P/N junction integrated with said semiconductor substrate, said doped P/N junction comprising a depletion layer and having a shape defining a waveguide, said depletion layer comprising at least one rare-earth material for providing a coherent light source, all of said at least one rare-earth material remaining in said depletion layer when the semiconductor laser device is operating; and a biasing device connected to said doped P/N junction for reverse biasing thereof to produce coherent light by pumping said at least one rare-earth material at room temperature;

said at least one rare-earth material being buried within said doped P/N junction at a depth sufficient for defining an acceleration space between a region of said doped P/N junction that generates carriers when said at least one rare-earth material is being pumped, the acceleration space allowing the carriers to be accelerated before reaching said at least one rare-earth material.

2. A semiconductor laser device according to claim 1, wherein said at least one rare-earth material comprises erbium.

3. A semiconductor laser device according to claim 1, further comprising a protective layer partially on said doped P/N junction to delimit sides of the waveguide, said protective layer having a lower dielectric constant than a dielectric constant of said doped P/N junction.

4. A semiconductor laser device according to claim 1, further comprising a buried reflecting layer to delimit a bottom of the waveguide.

5. A semiconductor laser device according to claim 1, wherein said semiconductor substrate comprises a silicon on insulator (SOI) substrate.

6. A semiconductor laser device according to claim 1, further comprising an epitaxial layer on said semiconductor substrate.

7. A semiconductor laser device according to claim 1, wherein said doped P/N junction is stacked so that the shape of the waveguide is a ribbed elongated structure projecting from a surface of said semiconductor substrate.

8. A semiconductor laser device according to claim 1, wherein said semiconductor substrate comprises silicon.

9. A semiconductor laser device comprising:
a semiconductor substrate;
a doped P/N junction integrated with said semiconductor substrate, said doped P/N junction comprising a depletion layer and having a shape defining a waveguide, said depletion layer comprising at least one rare-earth material for providing a coherent light source, and all of said at least one rare-earth material remaining in said depletion layer when the semiconductor laser device is operating; and
a biasing device connected to said doped P/N junction for reverse biasing thereof to produce coherent light from the coherent light source by pumping said at least one rare-earth material;
said at least one rare-earth material being buried within said doped P/N junction at a depth sufficient for defining an acceleration space between a region of said doped P/N junction that generates carriers when said at least one rare-earth material is being pumped, the acceleration space allowing the carriers to be accelerated before reaching said at least one rare-earth material.

10. A semiconductor laser device according to claim 9, wherein said at least one rare-earth material comprises erbium.

11. A semiconductor laser device according to claim 9, further comprising a protective layer partially on said doped P/N junction to delimit sides of the waveguide, said protective layer having a lower dielectric constant than a dielectric constant of said doped P/N junction.

12. A semiconductor laser device according to claim 9, wherein said doped P/N junction is stacked so that the shape of the waveguide is a ribbed elongated structure projecting from a surface of said semiconductor substrate.

13. A semiconductor laser device according to claim 9, wherein said semiconductor substrate comprises a silicon on insulator (SOI) substrate.

14. A semiconductor laser device according to claim 9, further comprising an epitaxial layer on said semiconductor substrate.

15. A semiconductor laser device according to claim 9, further comprising a buried reflecting layer to delimit a bottom of the waveguide.

16. A semiconductor laser device according to claim 9, wherein said semiconductor substrate comprises silicon.

* * * * *